(12) United States Patent
Hahm

(10) Patent No.: US 6,356,606 B1
(45) Date of Patent: Mar. 12, 2002

(54) DEVICE AND METHOD FOR LIMITING PEAKS OF A SIGNAL

(75) Inventor: Mark David Hahm, Mt. Arlington, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/126,743

(22) Filed: Jul. 31, 1998

(51) Int. Cl.[7] .............................................. H04B 1/10
(52) U.S. Cl. ...................... 375/350; 375/317; 327/180
(58) Field of Search ................... 375/350, 317, 375/296, 346; 327/180

(56) References Cited

U.S. PATENT DOCUMENTS

| | | | | |
|---|---|---|---|---|
| 3,697,875 A | * | 10/1972 | Guanella | 325/65 |
| 4,295,106 A | * | 10/1981 | Kahn | 332/37 |
| 4,667,237 A | * | 5/1987 | Yokomizo | 358/160 |
| 5,287,387 A | | 2/1994 | Birchler | 375/60 |
| 5,638,403 A | | 6/1997 | Birchler et al. | 375/296 |
| 5,762,068 A | | 6/1998 | dePinto | 128/696 |

FOREIGN PATENT DOCUMENTS

| | | |
|---|---|---|
| DE | 19548172 | 5/1996 |
| EP | 0545596 | 6/1993 |

* cited by examiner

Primary Examiner—Mohammad H. Ghayour

(57) ABSTRACT

A method and device for limiting peaks of an input signal. The device and method isolate peaks of an input signal based on a clipping threshold voltage, generate an extrema signal representing the local extrema of the peak isolated signal, filter the extrema signal based on an appropriate impulse filter response to generate a filter signal, and combine the filter signal with the input signal delayed by a predetermined time period to generate an impulse clipped signal. The impulse clipped signal has a reduced P/A ratio and is without significant out-of-band spectrum artifacts.

22 Claims, 13 Drawing Sheets

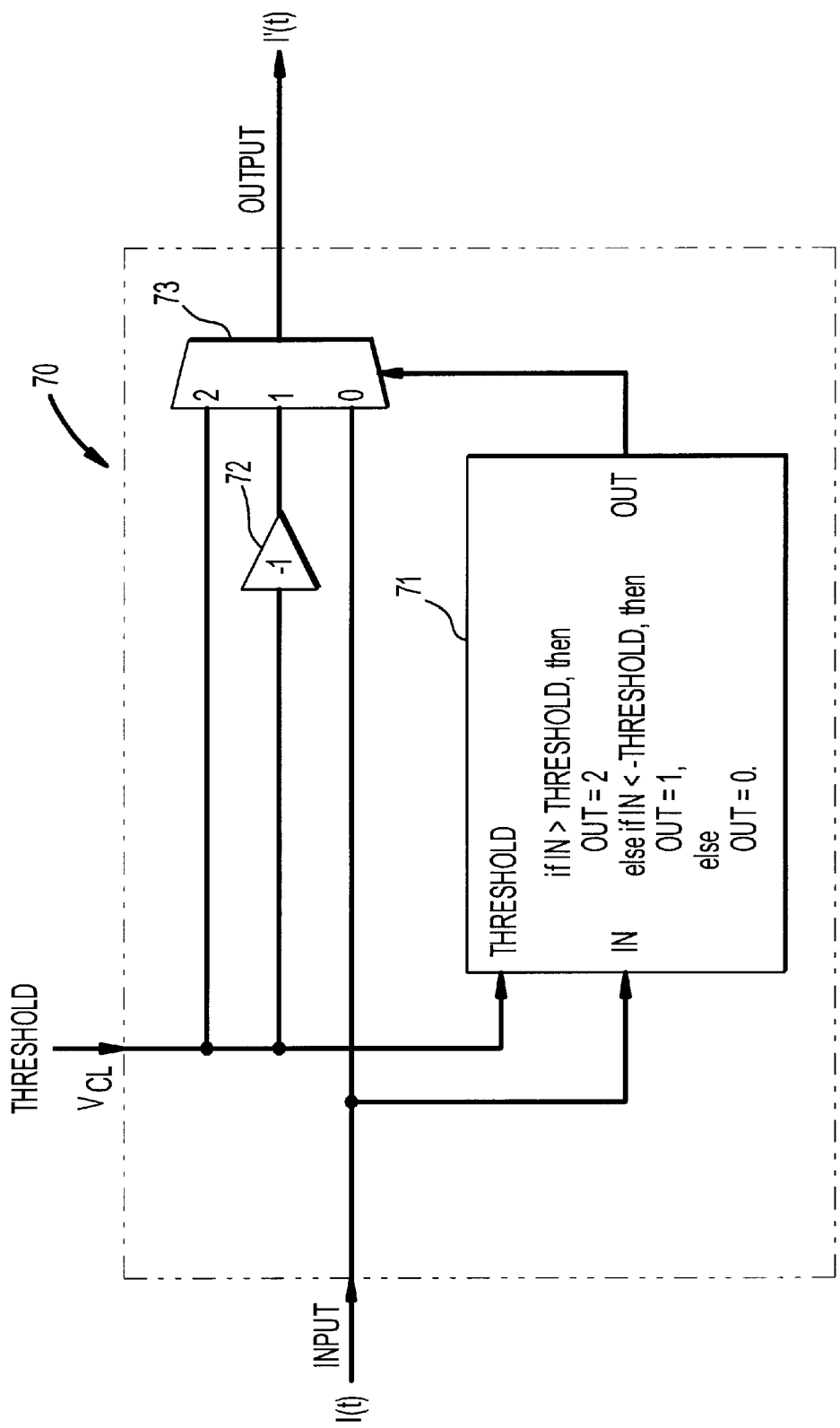

DEVICE AND METHOD FOR LIMITING PEAKS OF A SIGNAL

BACKGROUND OF THE INVENTION

1. Field of the Invention

The present invention relates to a device and method for limiting peaks of a signal and, more particularly, to a device and method for reducing the peak-to-average (P/A) ratio of an input signal without generating significant out-of-band emissions.

2. Description of Related Art

Power amplifiers have non-linear characteristics. The cost of power amplifiers is determined by the size of their linear range. The non-linear characteristic of conventional power amplifiers causes out-of-band spectral artifacts, e.g., spectrum distortions, splatters, spectrum spreading, etc. By reducing the peaks of a signal input to the power amplifier, the P/A ratio of the input signal is reduced, allowing the amplifier to output a large average power.

A hard clipping process is one of the conventional ways to reduce the P/A ratio of an input signal. The effect of the hard clipping process is that a noise-like signal is added to the input signal to generate a hard clipped signal. The algorithm of the hard clipped signal is as follows, wherein $V_{in}$ represents the input signal, $V_{clip}$ represents the clipping threshold signal, and $V_{out}$ represents the hard clipped signal.

If $V_{in} \geq V_{clip}$, then $V_{out} = V_{clip}$, or if $V_{in} \leq -V_{clip}$, then $V_{out} = -V_{clip}$, else $V_{out} = V_{in}$.

A hard clipped signal has abrupt edges and sharp peaks. The abrupt nature of the hard clipping process and the short time duration of clipped edges generate significant out-of-band spectral artifacts, such as spectrum distortions, splatter, and spectrum spreading. For example, when an input signal, whose spectrum is illustrated in FIG. 1, is peak-limited by the conventional hard clipping process, the effect in the frequency domain is to add the spectrum of a noise-like signal, shown in FIG. 2A, to the input signal spectrum of FIG. 1. The spectrum of the final result of the hard clipping process is then as shown in FIG. 2B. Although the spectrum response of the input signal outside of about 0.3 frequency units is low, the spectrum of the hard clipped signal outside of about 0.3 frequency units is much higher than that of the input signal. Therefore, the hard clipping process is generally undesirable in reducing the P/A ratio of an input signal.

A window clipping process discussed in U.S. Pat. No. 5,287,387 is another conventional method of reducing the P/A ratio of a signal. In the window clipping process, an attenuating window signal is multiplied with the input signal to generate an attenuated signal. Portions of the attenuating window signal corresponding to the peak areas of the input signal have a value of less than one, and all other portions have a value of one. Therefore, when the attenuating window signal is multiplied with the input signal, the peak areas of the input signal is reduced, and all other areas remain the same. However, multiplying the signal in the time domain is equivalent to convolving the spectrum of the input signal with the window spectrum in the frequency domain. This results in a wider spectrum, i.e., spectrum spreading. The window clipping process introduces undesirable spectrum spreading while attempting to reduce the splatter and the P/A ratio of the input signal, and thus, fails to adequately address the problems of the conventional clipping processes.

SUMMARY OF THE INVENTION

The present invention is directed to an improved method and device for limiting peaks of an input signal. The method and device isolate peaks of an input signal based on a clipping threshold voltage, generate an extrema signal representing the local extrema of the peak isolated signal, filter the extrema signal to generate a filter signal, and combine the filter signal with the input signal delayed by a predetermined time period to generate an impulse clipped signal. The impulse clipped signal has a reduced P/A ratio and is without significant out-of-band spectrum artifacts.

BRIEF DESCRIPTION OF THE DRAWINGS

The present invention will become more fully understood from the detailed description given hereinbelow and the accompanying drawings which are given by way of illustration only, wherein reference numerals designate corresponding parts in the various drawings and wherein:

FIG. 8 shows an exemplary logic circuit of a hard limiting unit of the device shown in FIG. 3:

DETAILED DESCRIPTION OF THE PREFERRED EMBODIMENTS

The following detailed description relates to a device and method for limiting peaks of an input signal using an impulse clipping process according to the present invention.

Figure 3:
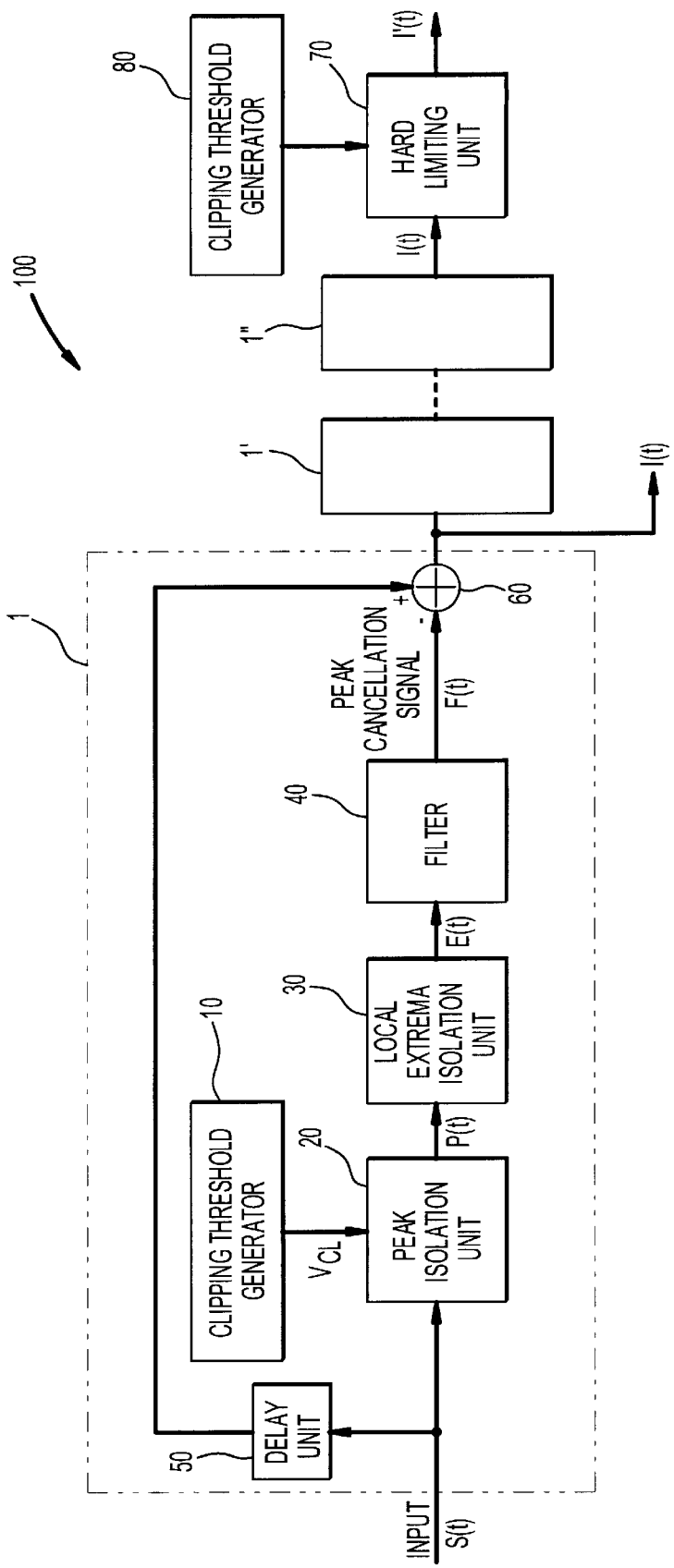
FIG. 3 shows a block diagram of an exemplary device for limiting peaks of an input signal according to one embodiment of the present invention.

FIG. 3 shows a block diagram of a device for limiting peaks of a signal according to the present invention. As shown in FIG. 3, the device 100 includes a clipping threshold generator 10 for generating a clipping threshold signal $V_{CL}$, a peak isolation unit 20 for receiving an input signal S(t) and generating a peak signal P(t) of the input signal S(t) based on the clipping threshold signal $V_{CL}$, a local extrema isolation unit 30 for receiving the peak signal P(t) and generating an extrema signal E(t) based on the peak signal P(t), a filter 40 for filtering the extrema signal E(t) according to an appropriate impulse response of the filter 40 and generating a peak cancellation signal F(t), a delay unit 50 for delaying the input signal S(t) for a predetermined time period, and an adder 60 for combining the delayed input signal S(t) with the peak cancellation signal F(t) and generating an impulse clipped signal I(t) with a reduced P/A ratio and an improved spectrum response.

The clipping threshold generator 10, the peak isolation unit 20, the local extrema isolation unit 30, the filter 40, the delay unit 50, and the adder 60 constitute a single impulse clipping stage 1 of the invention. By adding a plurality of the single impulse clipping stages 1, 1', 1" . . . , multiple stages of impulse clipping may be optionally provided. Furthermore, a hard limiting unit 70 may be optionally provided in the device 100 to hard limit the impulse clipped signal I(t) according to a threshold signal so as to prevent formation of small peaks in the impulse clipped signal I(t). These small peaks are rare in the impulse clipped signal I(t), but if present, the hard limiting unit 70 can easily remove the small peaks. Another clipping threshold generator 80 provides the threshold signal to the hard limiting unit 70.

Figure 4:
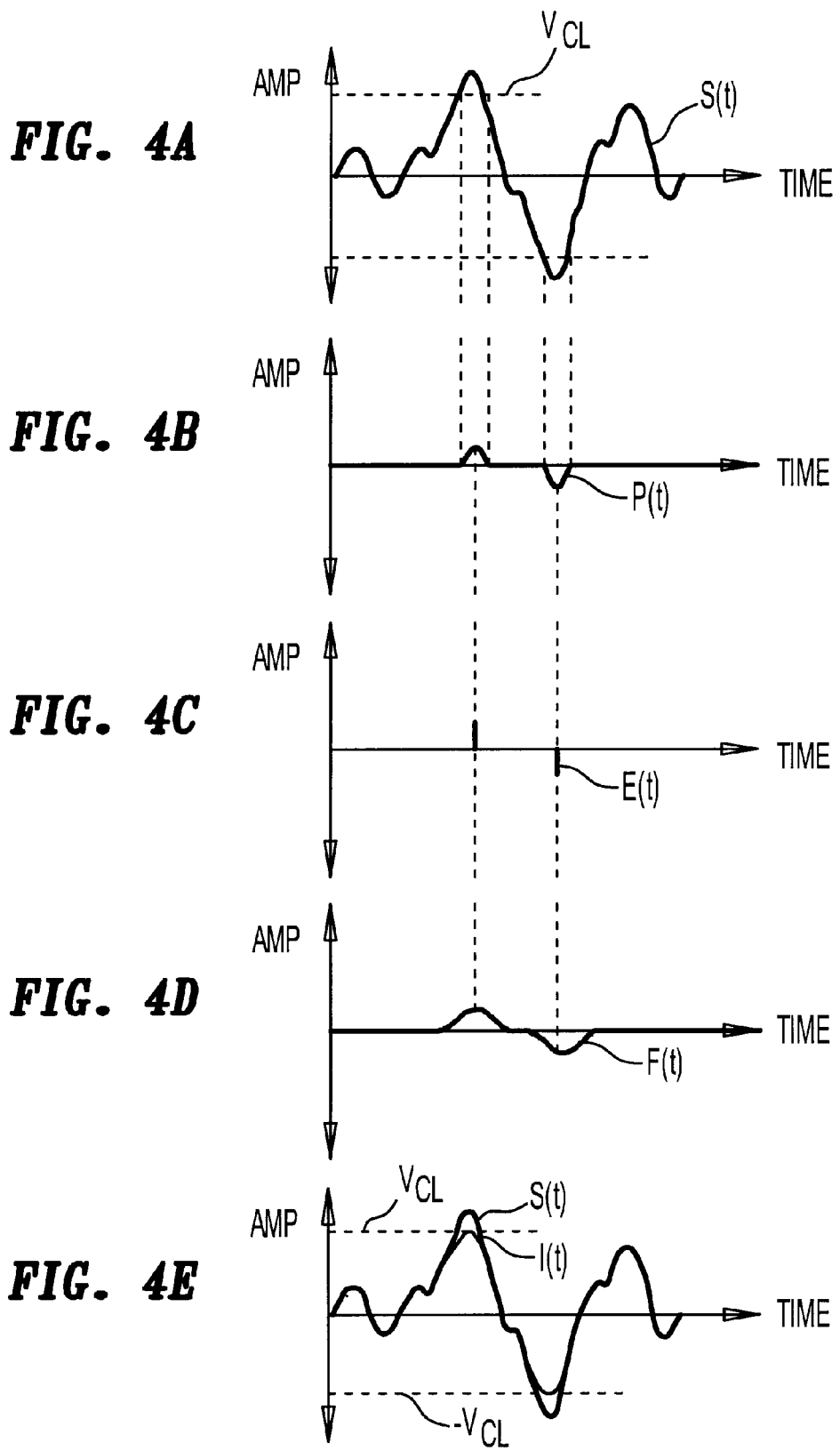
FIGS. 4A–4E show examples of signals generated at different stages of the device shown in FIG. 3.

FIGS. 4A–4E show examples of different signals output from the components of the device 100 shown in FIG. 3. The peak isolation unit 20 receives art input signal S(t), an example of which is shown in FIG. 4A. Based on a certain clipping threshold signal $V_{CL}$, the peak isolation unit 20 isolates peaks of the input signal S(t) to generate a peak signal P(t), an example of which is shown in FIG. 4B. The local extrema isolation unit 30 receives the peak signal P(t) and further isolates the local extrema of the peak signal P(t) to generate an extrema signal E(t). The extrema signal E(t) resembles impulse signals, and an example of the extrema signal E(t) is shown in FIG. 4C. The filter 40 receives the extrema signal E(t) from the local extrema isolation unit 30 and filters it to generate a peak cancellation signal F(t), an example of which is shown in FIG. 4D. The adder 60 subtracts the peak cancellation signal F(t) from a delayed input signal S(t) to generate an impulse clipped signal I(t), an example of which is shown in FIG. 4E.

The peak signal P(t) is defined as:

0 if −clipping threshold ≤ $S(t)$ ≤ clipping threshold $P(t)$=($S(t)$−clipping threshold) if $S(t)$>clipping threshold ($S(t)$+clipping threshold) if $S(t)$<−clipping threshold.

The extrema signal E(t) is defined as:

$E(t)=\delta(t-\tau_{peak}) \times P(t)$ if $|P(t-\tau_{peak}-\Delta)|$ and $|P(t-\tau_{peak}+\Delta)|$ are both ≤ $|P(t-\tau_{peak})|$ wherein $\tau_{peak}$ is a time at which a local extrema occurs and $\Delta$ represents a certain time unit.
The peak cancellation signal F(t) is defined as:

$F(t)=G(t)*E(t)$ wherein G(t) represents the impulse response of the filter 40 and "*" represents a convolution operation implemented by the filter 40.
Finally, the impulse clipped signal I(t) is defined as:

$I(t)=S(t)-F(t)$.

Detailed descriptions of the components of the device 100 shown in FIG. 3 will be provided below referring to FIGS. 5–8. It should be understood that these figures merely depict examples of the components, and that other structures or configurations known in the art can be used to accomplish the same operation.

The clipping threshold generator 10 of FIG. 3 generates a clipping threshold signal $V_{CL}$. The clipping threshold signal $V_{CL}$ is a certain voltage value at which the input signal S(t) is clipped. This value may be a fixed value stored in a memory of the clipping threshold generator 10, or can be a programmable parameter controlled by the clipping threshold generator 10 or other external devices. The clipping threshold generator 10 can be controlled by a CPU or other processors so that the clipping threshold signal $V_{CL}$ is varied according to predetermined conditions, for example, system load or system operation.

Figure 5:
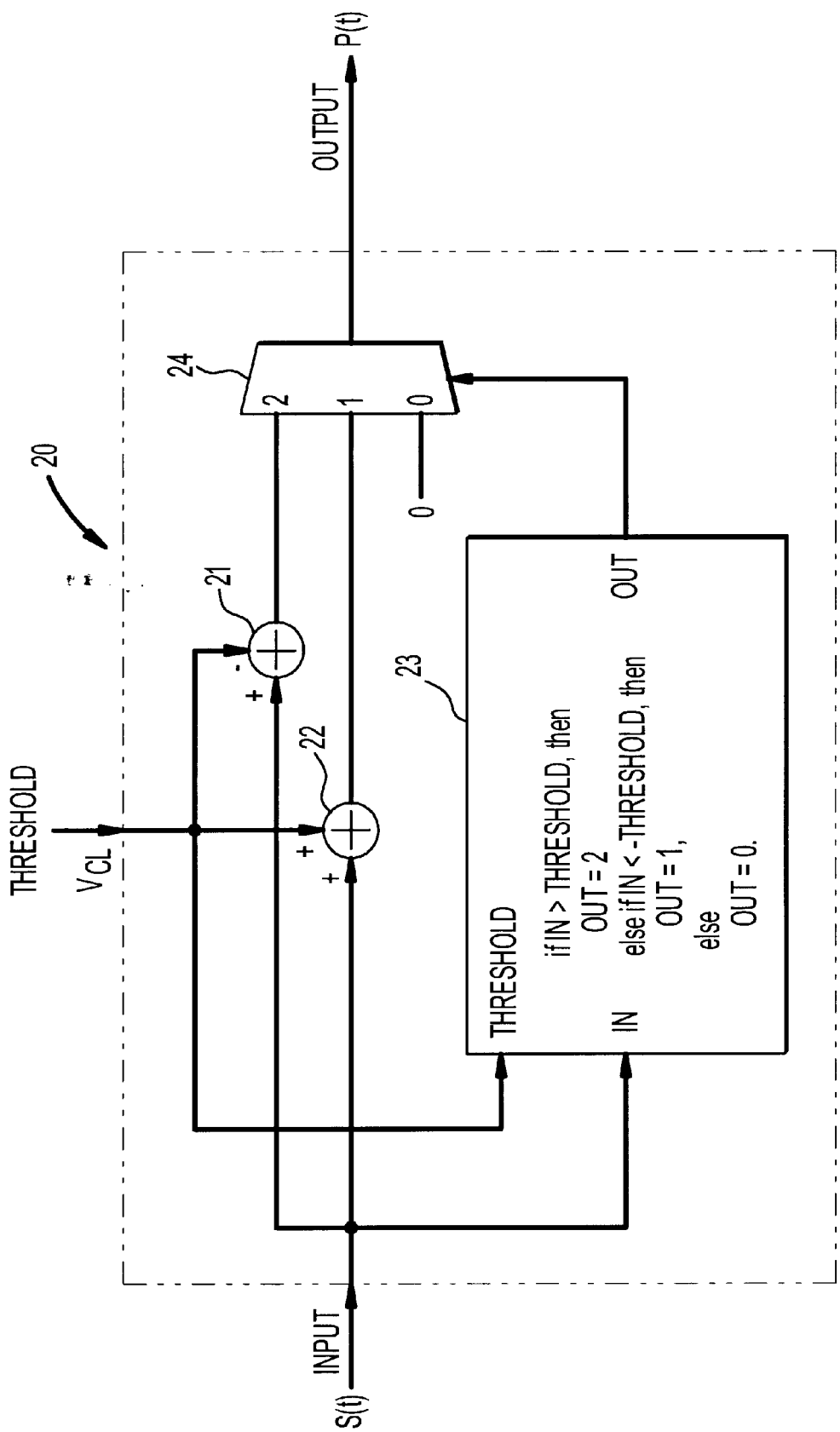
FIG. 5 shows an exemplary logic circuit of a peak isolation unit of the device shown in FIG. 3.

The clipping threshold signal $V_{CL}$ embodying the clipping threshold value is output to the peak isolation unit 20. FIG. 5 shows an example of a logic circuit of the peak isolation unit 20 of FIG. 3. As shown in FIG. 5, the peak isolation unit 20 includes a plurality of adders 21 and 22, a comparator 23, and a multiplexer 24. The first adder 21 adds the clipping threshold signal $V_{CL}$ and the input signal S(t), and outputs the addition result to a "1" input port of the multiplexer 24. The second adder 22 subtracts the clipping threshold signal $V_{CL}$ from the input signal S(t), and outputs the result to a "2" input port of the multiplexer 24. The multiplexer 24 includes the "2" input port, the "1" input port, and a grounded "0" input port.

The comparator 23 of the peak isolation unit 20 receives the clipping threshold signal $V_{CL}$ and the input signal S(t) as THRESHOLD and IN inputs, respectively. The comparator 23 compares IN and THREHSOLD inputs to each other. If IN>THRESHOLD, then the comparator 23 generates a selection signal for selecting the "2" input port of the multiplexer 24. If IN<−THRESHOLD, then the comparator 23 generates a selection signal for selecting the "1" input port of the multiplexer 24. Otherwise, the comparator 23 generates a selection signal for selecting the "0" input port of the multiplexer 24. According to the selection signal from the comparator 23, the multiplexer 24 outputs one of the signals from the "2", "1", and "0" input ports to generate the peak signal P(t).

Figure 6:
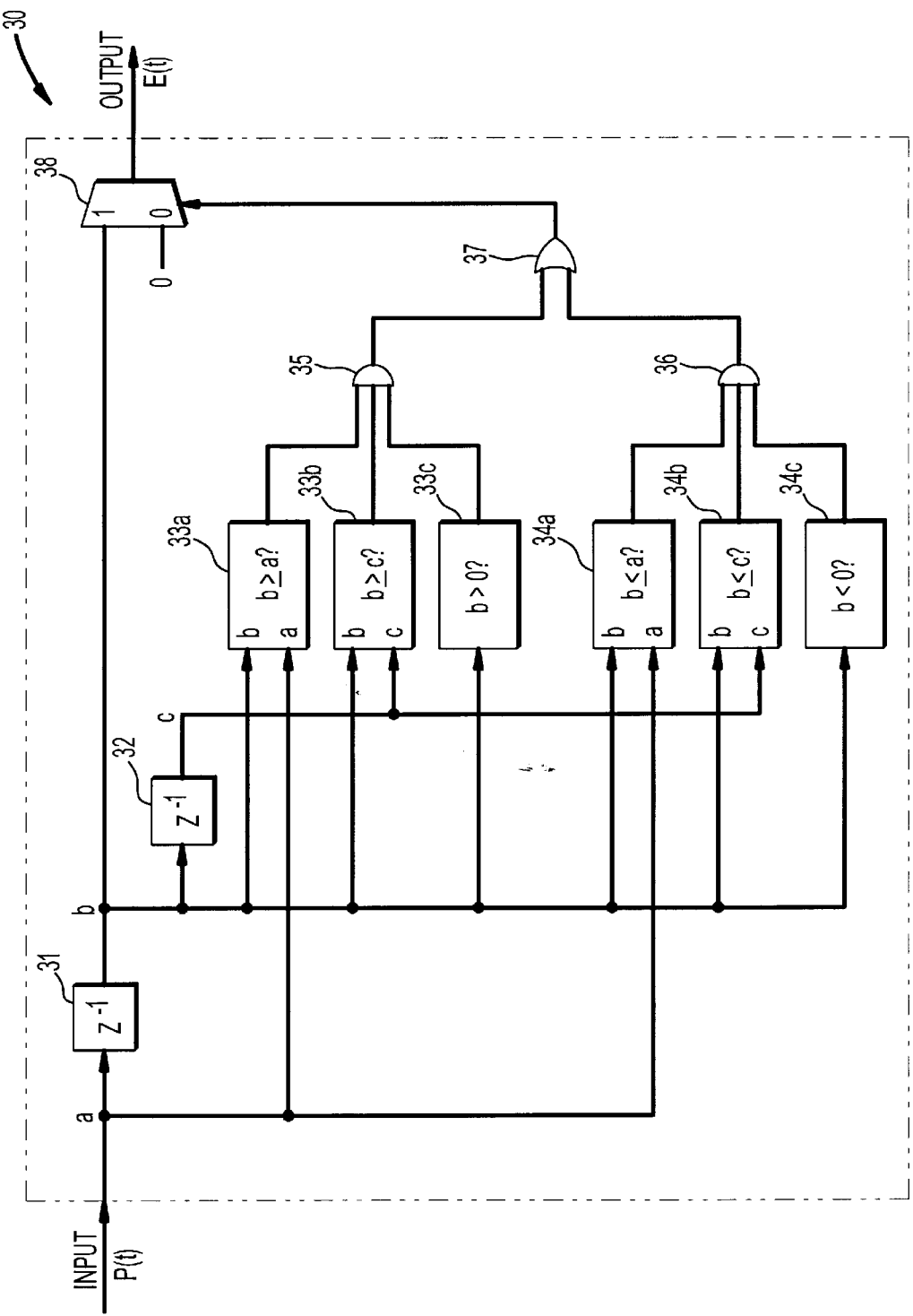
FIG. 6 shows an exemplary logic circuit of a local extrema isolation unit of the device shown in FIG. 3.

The peak signal P(t) is input to the local extrema isolation unit 30 of FIG. 3. FIG. 6 shows an exemplary logic circuit of the local extrema isolation unit 30. As shown in FIG. 6, the local extrema isolation unit 30 includes a plurality of delay elements 31 and 32, a plurality of comparators 33a–33c and 34a–34c coupled to the delay elements 31 and 32, a plurality of AND-gates 35 and 36 coupled to the comparators 33a–33c and 34a–34c, an OR-gate 37 coupled to the AND-gates 35 and 36, and a multiplexer 38 coupled to the first delay element 31 and the OR-gate 37.

The first delay element 31 delays the peak signal P(t) input to the local extrema isolation unit 30 for a predetermined time period. The second delay element 31 further delays the signal delayed by the first delay element 32 for the predetermined time period. The first comparator 33a receives the output of the first delay element 31 and the peak signal P(t), determines whether the output of the first delay element 31 is greater than or equal to the peak signal P(t), and generates a high level signal if yes and a low level signal if no. The second comparator 33b compares the outputs of the first and second delay elements 31 and 32. If the output of the first delay element 31 is greater than or equal to the output of the second delay element 32, the second comparator 33b generates a high level signal. Otherwise, the second comparator 33b generates a low level signal to the first AND-gate 35. The third comparator 33c determines whether the output of the first delay element 31 is greater than zero, and generates a high level signal if yes, and a low level signal if no. The first AND-gate 35 ANDs the outputs of the first, second and third comparators 33a–33c to generate an output signal to the OR-gate 37. The comparators 33a–33c process positive-valued samples of the peak signal P(t) whereas the comparators 34a–34c process negative-valued samples of the peak signal P(t).

The fourth comparator 34a determines whether or not the output of the first delay element 31 is less than or equal to the peak signal P(t), and generates a high level signal if yes, and a low level signal if no. The fifth comparator 34b determines whether or not the output of the first delay element 31 is less than or equal to the output of the second delay element 32, and generates a high level signal if yes, and a low level signal if no. The sixth comparator 34c determines whether or not the current value of the peak signal P(t) is negative, and generates a high level signal if yes, and a low level signal if no. The outputs of the fourth, fifth, and sixth comparators 34a–34c are output to the second AND-gate 36. The outputs of the first and second AND-gates 35 and 36 are received by the OR-gate 37, and the OR-gate 37 generates either a high level signal or a low level signal according to the OR-gate logic. If the OR-gate 37 generates a high level signal to the multiplexer 38, the multiplexer 38 selects the output of the first delay element 31 as its output. If the OR-gate 37 generates a low level signal to the multiplexer 38, the multiplexer 38 selects the ground voltage as its output. Accordingly, the local extrema isolation unit 30 isolates the local extrema of the peak signal P(t) to generate the extrema signal E(t).

Figure 7A:
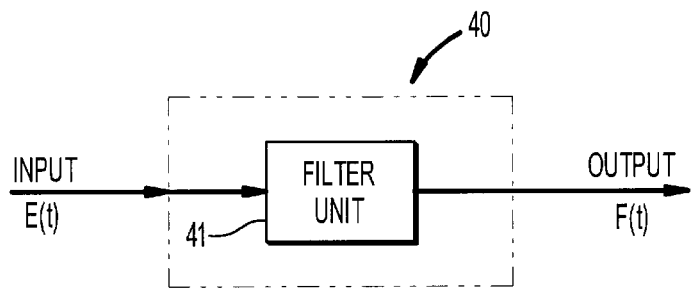
FIG. 7A shows an exemplary structure of a filter of the device shown in FIG. 3.

The filter 40 of FIG. 3 convolves (filters) the extrema signal E(t) of the local extrema isolation unit 30 through a filter having a predetermined impulse response. FIG. 7A shows an example of the filter 40. As shown in FIG. 7A, the filter 40 includes a Finite Impulse Response (FIR) filter unit 41 which has a certain filtering characteristic. The FIR filter unit 41 provides an impulse response that constricts a majority of the filter's spectral energy to the band-pass region of the original input signal S(t). The FIR filter unit 41 can provide an impulse response, such as a window function including a Kaiser window, a Hamming window, a Hanning window, or any other impulse response that has the desired spectral characteristics of a low pass filter.

Figure 7B:
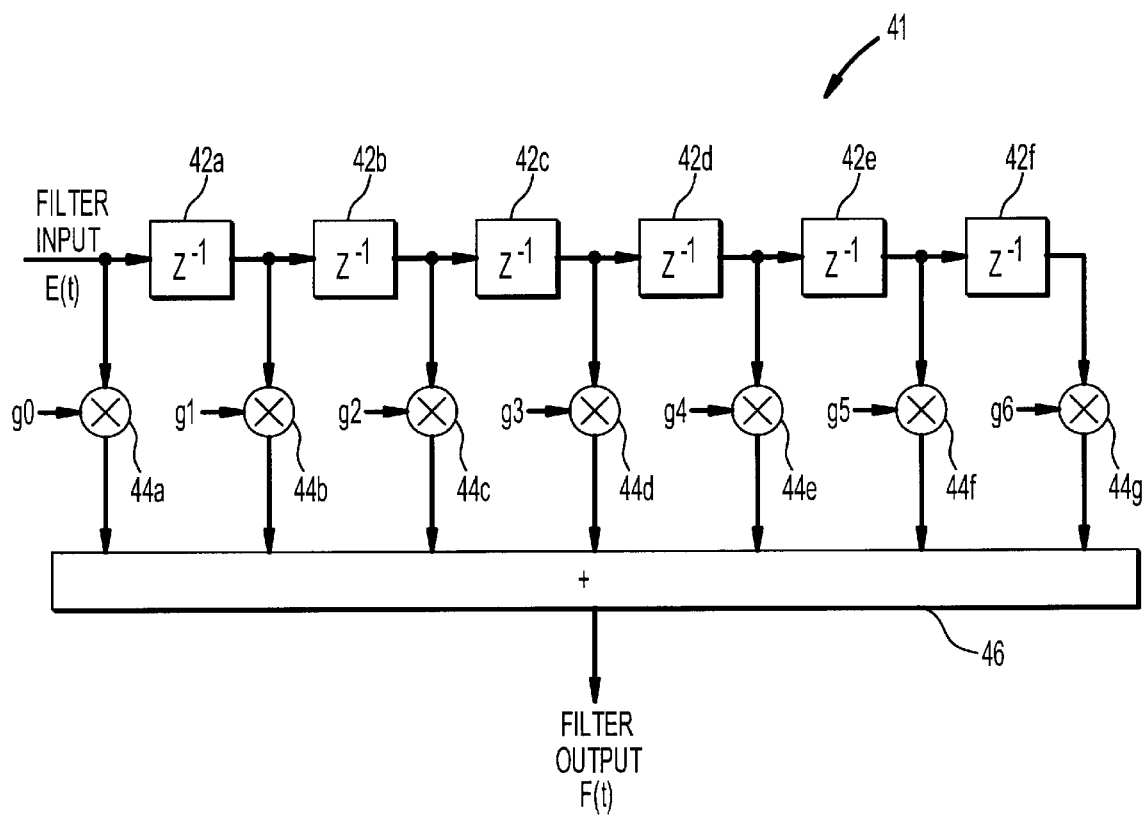
FIG. 7B shows an exemplary logic circuit of a filter unit of the filter shown in FIG. 7A.

FIG. 7B shows an exemplary logic circuit of the FIR filter unit 41 of FIG. 7A. As shown in FIG. 7B, the FIR filter unit 41 includes a plurality of delay elements 42a–42f connected to each other in series, a plurality of multipliers 44a–44g connected to the plurality of delay elements 44a–44f, and an adder 46 connected to the plurality of multipliers 44a–44g. Here, it is preferred that the delay elements 42a–44f delay their input signal for the same delay time period. The multipliers 44a–44g multiply the extrema signal E(t) and the output of the delay elements 42a–42f with corresponding filter coefficients g0–g6.

The first multiplier 44a multiplies the extrema signal E(t) input to the filter unit 41 with the first filter coefficient g0. The first delay element 42a delays the extrema signal E(t) by a predetermined delay time period, and outputs the delayed extrema signal E(t) to the second delay element 42b and the second multiplier 44b. The second multiplier 44b multiplies the delayed extrema signal E(t) with the second filter coefficient g1. Similarly, the second, third, fourth, fifth and sixth delay elements 42b–42f further delay the delayed extrema signal E(t) by the predetermined delay time period, and output the delayed extrema signal E(t) to the third, fourth, fifth, sixth, and seventh multipliers 44c–44g, respectively. The multipliers 44c–44g multiply the delayed extrema signal E(t) with the third, fourth, fifth, sixth, and seventh coefficients g2–g6, respectively. Although six delay elements and seven multipliers have been shown and described, the filter unit 41 can include any number of delay elements and multipliers to provide a desired filter characteristic.

The outputs of the multipliers 44a–44g are added by the adder 46, and the adder 46 outputs the addition result as the peak cancellation signal F(t).

The delay unit 50 of FIG. 3 delays the input signal S(t) for a predetermined time period to compensate for the processing delay of the peak isolation unit 20, the local extrema isolation unit 30, and the filter 40. The delay unit 50 can be composed of a plurality of shift registers, or in digital memory, the data can be read out after a predetermined time period. The delay unit 50 can be implemented as a CCD delay, an RC delay, or other known delays in the art.

The adder 60 of FIG. 3 adds the input signal S(t) delayed by the delay unit 50 and—(minus) peak cancellation signal F(t) generated by the filter 40. In the alternative, the adder 60 can subtract the peak cancellation signal F(t) of the filter 40 from the delayed input signal S(t). Such an adder or the like is known in the art.

FIG. 8 shows an exemplary logic circuit of the hard limiting unit 70 of FIG. 3. As shown in FIG. 8, the hard limiting unit 70 includes a comparator 71, an inverter 72, and a multiplexer 73. The inverter 72 inverts a clipping threshold signal $V_{CL}$ generated from a clipping threshold generator 80. The clipping threshold generator 80 may be the same as the clipping threshold generator 10, and the same clipping threshold signal $V_{CL}$ may be input to the peak isolation unit 20 and to the hard limiting unit 70. The comparator 71 receives the clipping threshold signal $V_{CL}$ and the impulse clipped signal I(t) as THRESHOLD and IN inputs, respectively. The comparator 71 determines whether or not IN is greater than or equal to THRESHOLD, and generates a selecting signal for selecting the "2" input port of the multiplexer 73 if yes. If IN is less than –THRESHOLD, then the comparator 71 generates a selection signal for selecting the "1" input port of the multiplexer 73. Otherwise, the comparator 71 generates a selection signal for selecting the "0" input port of the multiplexer 73.

The multiplexer 73 receives the clipping threshold signal $V_{CL}$, the output of the inverter 72, and the impulse clipped signal I(t) at its "2", "1", and "0" input ports, respectively. According to the selection signal from the comparator 71, one of the "2", "1", and "0" input ports of the multiplexer 73 is selected. Accordingly, a further peak-limited, impulse clipped signal I'(t) is generated. The impulse clipped signal I(t) or I'(t) of the present device 100 is a peak limited signal with a reduced P/A ratio, and is without significant out-of-band spectral artifacts.

Figure 9:
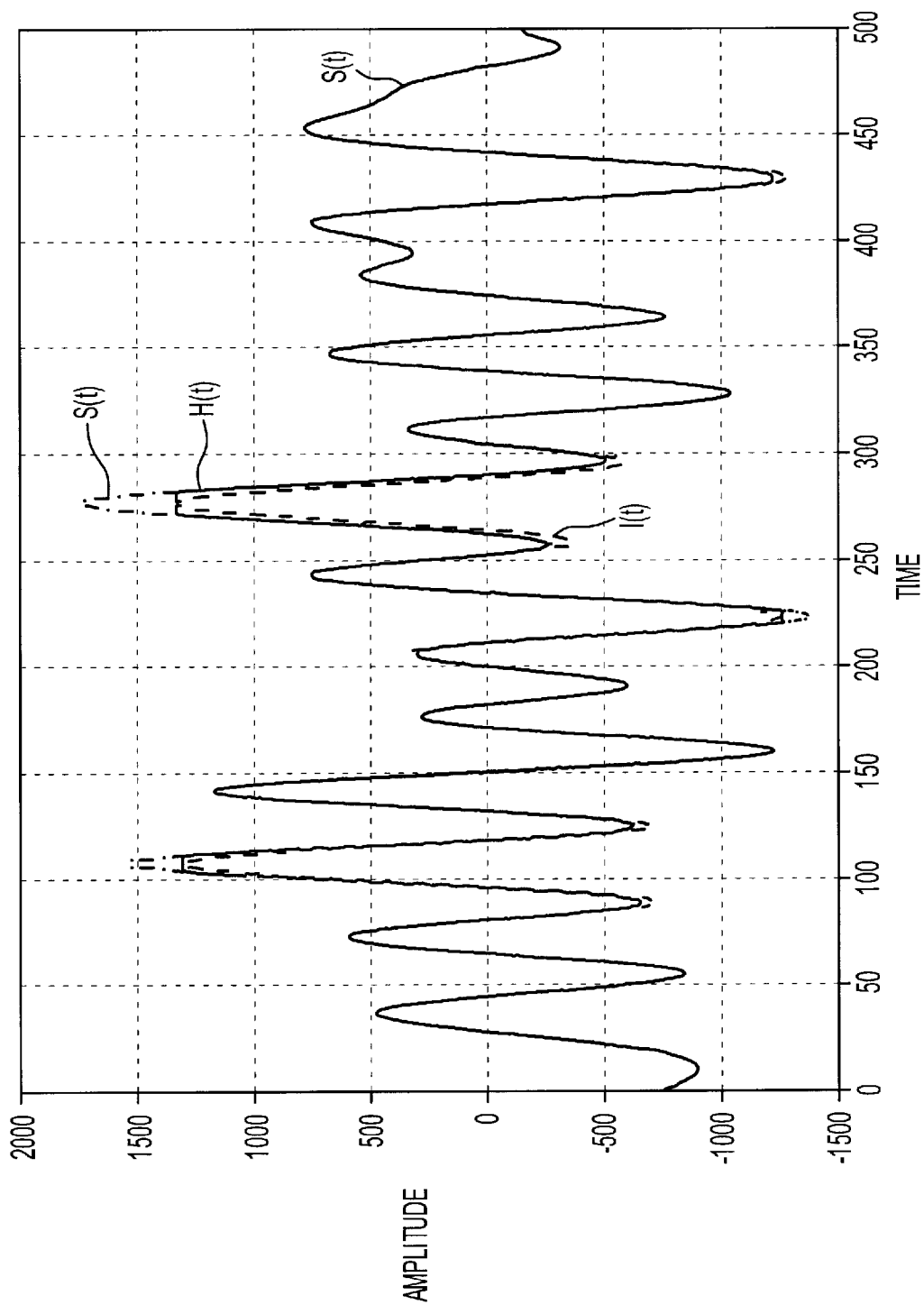
FIG. 9 shows an exemplary graph for comparing a hard clipped signal of the conventional art and an impulse clipped signal according to the present invention.

FIG. 9 shows a graph for comparing the impulse clipped signal I(t) of the present invention with the hard clipped signal H(t) of the conventional art. The input signal S(t) is represented with a dash-dot line, the hard clipped signal H(t) is represented with a solid line, and the impulse clipped signal I(t) (or I'(t)) is represented with a dashed line. The hard clipped signal H(t) depicts the input signal S(t) which has been hard-clipped according to the conventional hard clipping process. The impulse clipped signal I(t) depicts the input signal S(t) that has been peak-limited according to the impulse clipping operation of the present invention. The impulse clipped signal I(t) clearly has smoother peak edges than the hard clipped signal H(t), thereby reducing out-of-band spectral artifacts due to clipping.

Figure 10:
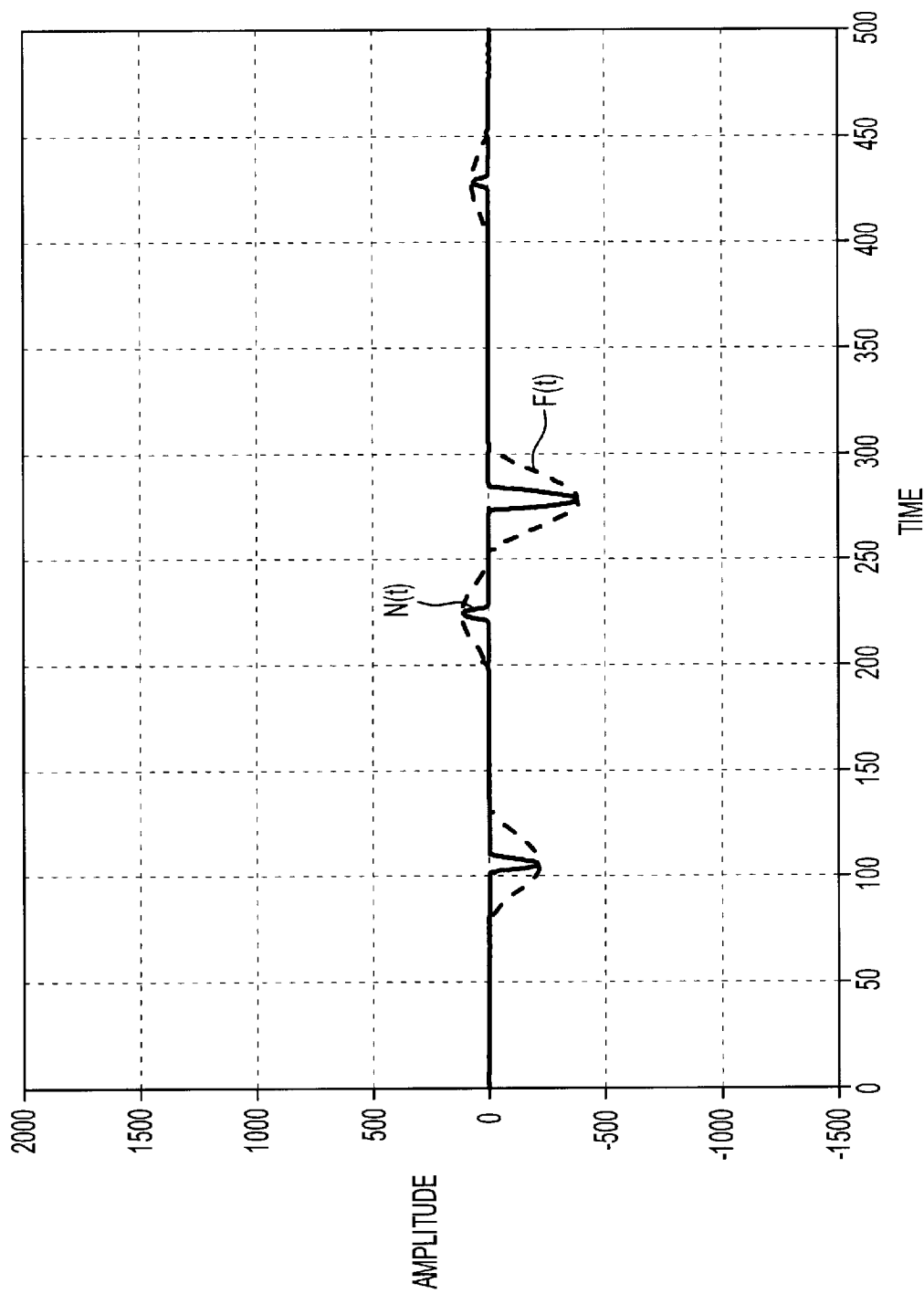
FIG. 10 shows an exemplary graph for comparing a noise-like signal of the conventional hard clipping process and a peak cancellation signal of the present invention.
Figure 11:
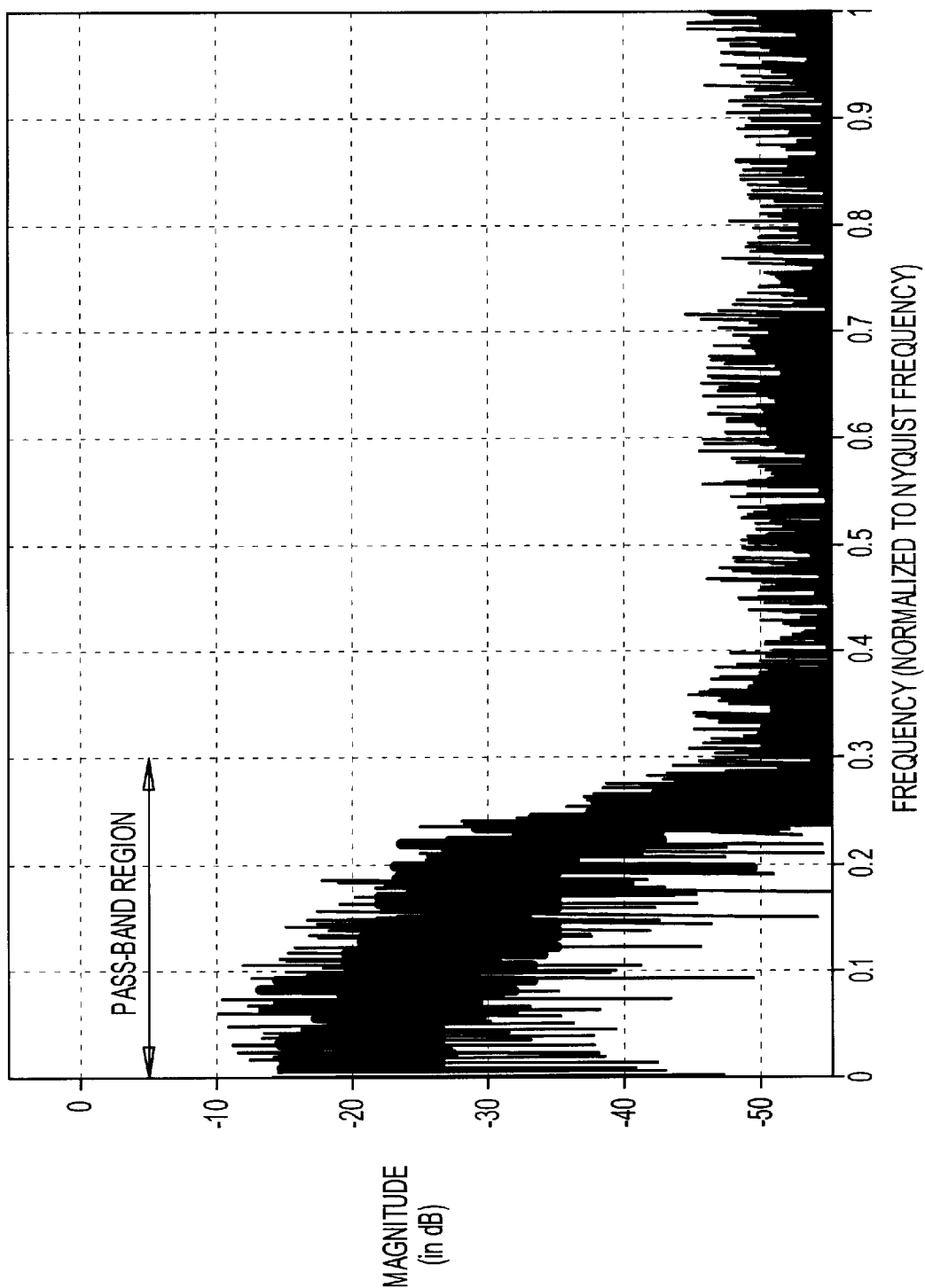
FIG. 11 shows a spectrum of a peak cancellation signal according to the present invention.

FIG. 10 shows an example of the peak cancellation signal F(t) of the present invention in comparison with a noise-like signal N(t) resulting from the conventional hard clipping process. The peak cancellation signal F(t), which is combined with the input signal S(t) in the present invention, has wider and smoother peaks than the noise-like signal N(t). FIG. 11 illustrates the spectrum of the peak cancellation signal F(t) showing a reduced spectrum emission outside of its pass-band region (about 0.3 frequency units).

Figure 1:
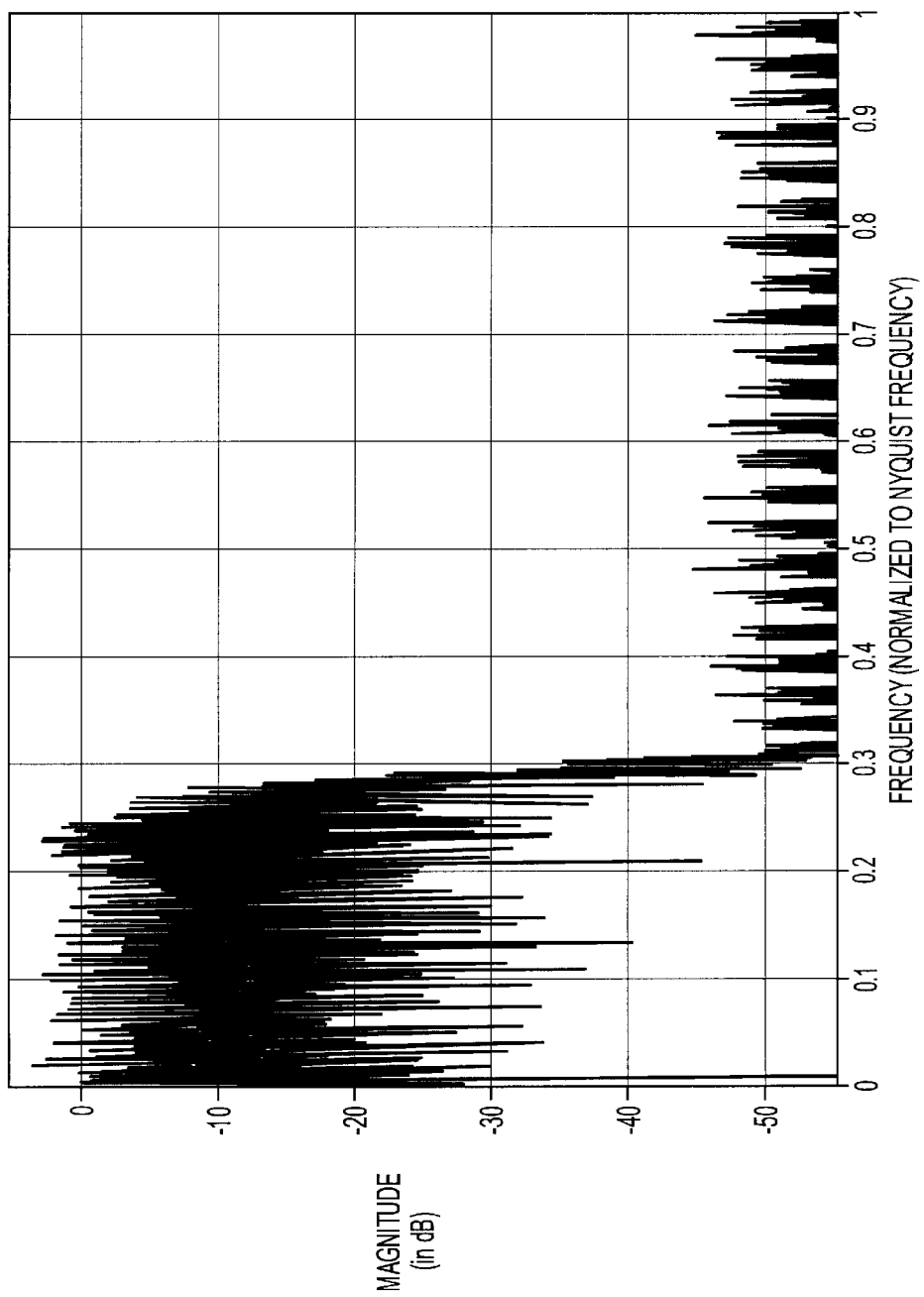
FIG. 1 shows a spectrum of an exemplary input signal.
Figure 2A:
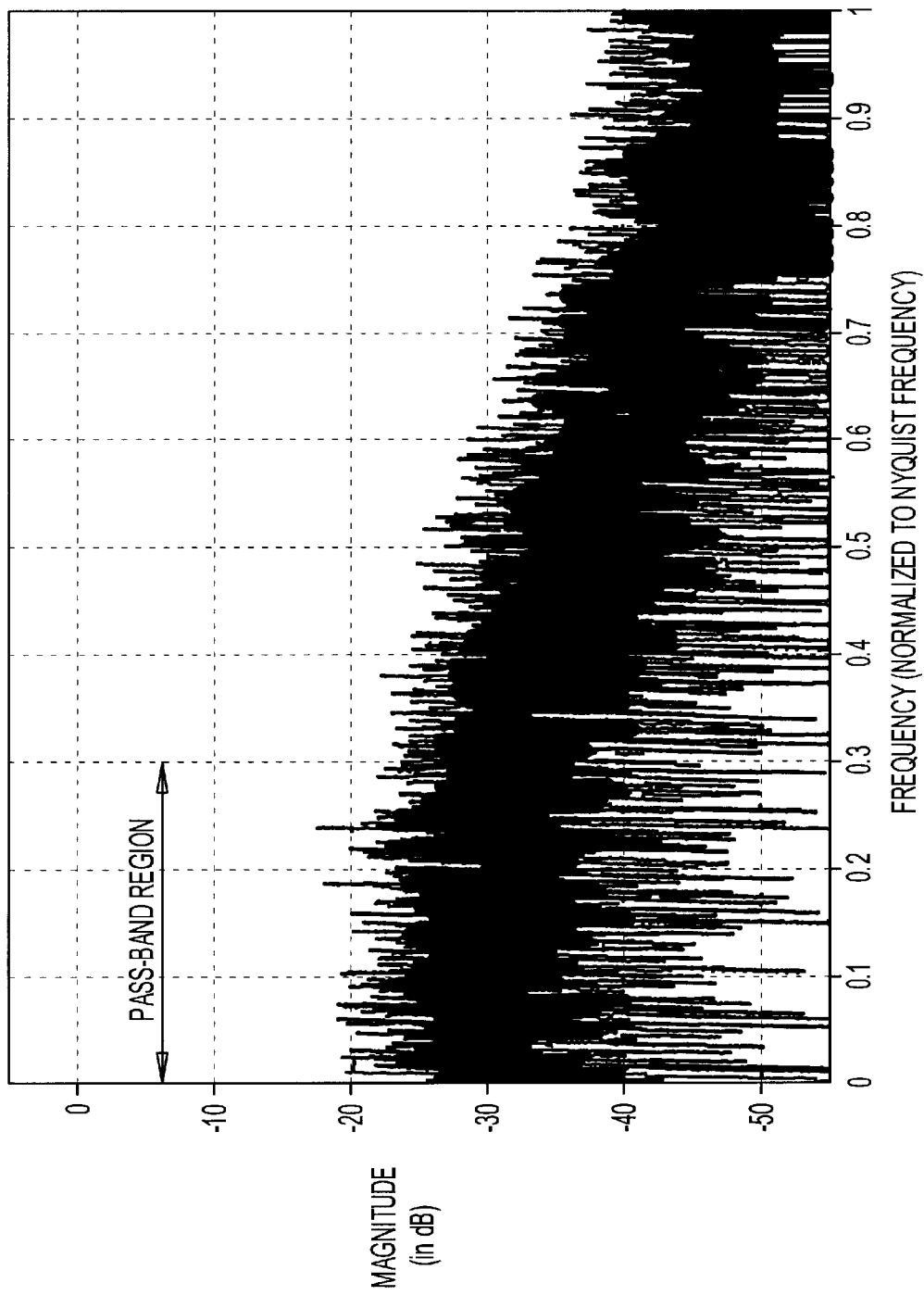
FIG. 2A shows a spectrum of an exemplary noise-like signal according to a conventional hard clipping process.
Figure 2B:
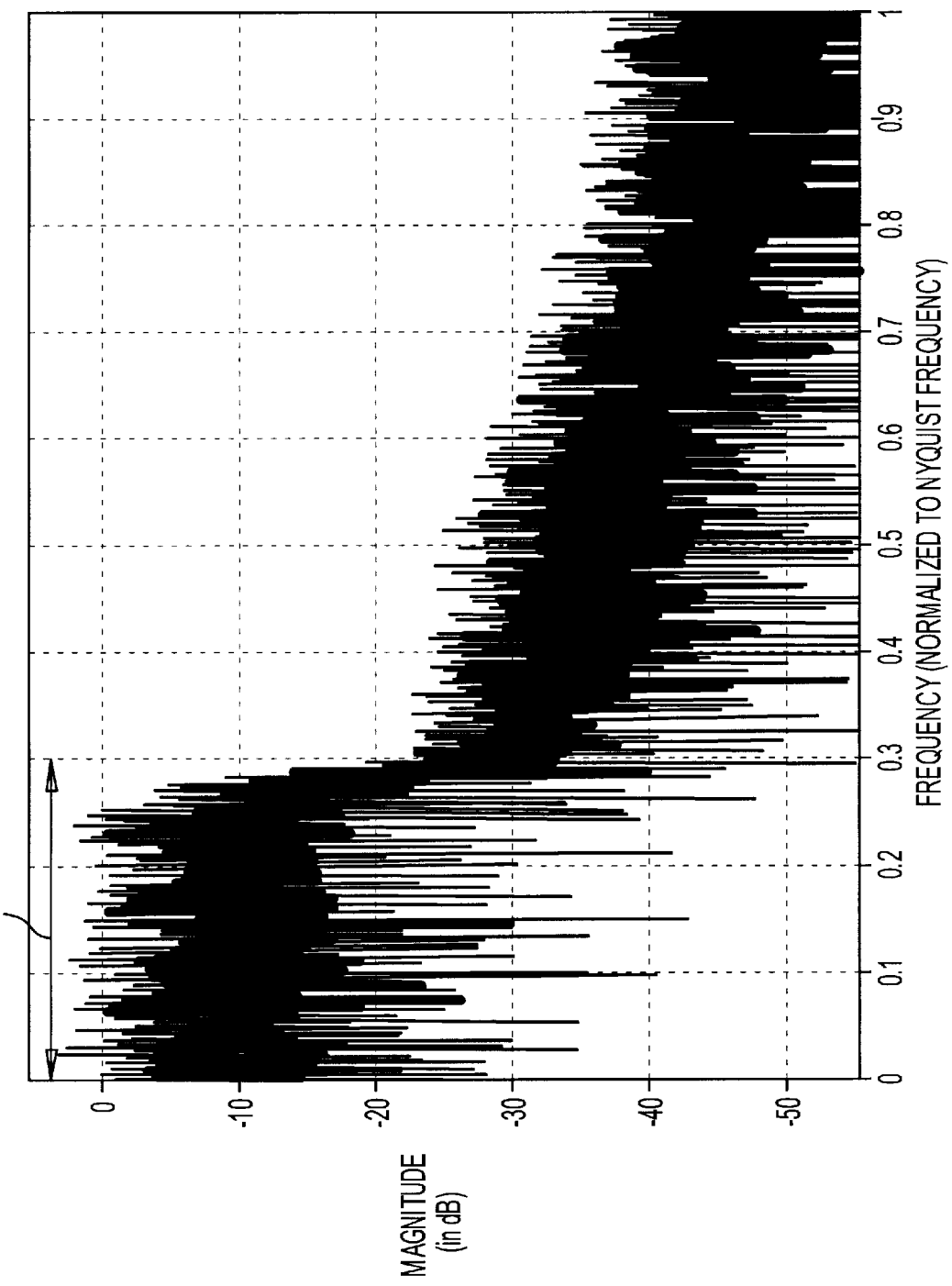
FIG. 2B shows a spectrum of a hard clipped signal resulting from summing the spectra of FIGS. 1 and 2A according to the conventional hard clipping process.
Figure 12:
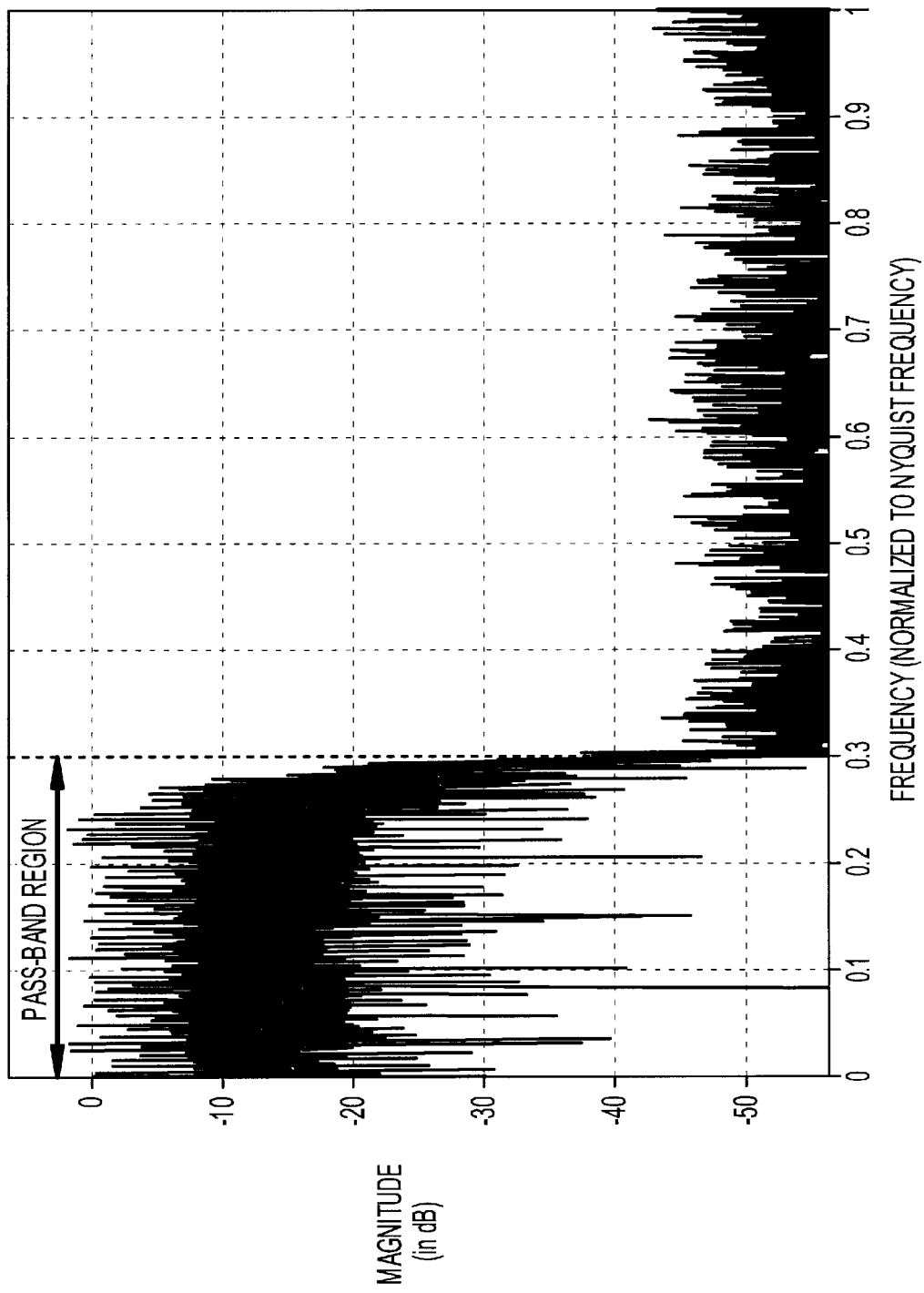
FIG. 12 shows a spectrum of an impulse clipped signal according to the present invention.

FIG. 12 shows the spectrum of the impulse clipped signal I(t) resulting from adding the input signal S(t) and the peak cancellation signal F(t) according to the present invention. It shows a significantly reduced spectrum emission outside of its pass-band region (about 0.3 frequency units), and a majority of the impulse clipped signal I(t) constrained within its pass-band region. In contrast, the spectrum of the hard clipped signal H(t) of the conventional hard clipping process, as shown in FIG. 2B, has a significantly high spectrum emission outside of its pass-band region.

A method of limiting peaks of an input signal according to the impulse clipping operation of the present invention will be described referring to FIGS. 3 and 4A–4E.

A clipping threshold signal $V_{CL}$ is generated by the clipping threshold generator 10 and input to the peak isolation unit 20. The peak isolation unit 20 isolates the peaks of an input signal S(t) as shown in FIG. 4A to generate a peak signal P(t) as shown in FIG. 4B. The local extrema of the peak signal P(t) are isolated by the local extrema isolation unit 30 to generate an extrema signal E(t) as shown in FIG. 4C. The extrema signal E(t) is filtered based on the impulse response of the filter 40 to generate a peak cancellation signal F(t) as shown in FIG. 4D. The peak cancellation signal F(t) is added with the delayed input signal S(t) to generate an impulse clipped signal I(t) as shown in FIG. 4E according to the present invention. Further, the impulse clipped signal I(t) can be hard clipped by the hard limiting unit 70 to generate a further limited, impulse clipped signal I'(t). The impulse clipped signal I(t) or I'(t) has a reduced P/A ratio compared to the hard clipped signal of the conventional art, and has reduced out-of-band spectral artifacts compared to the window clipped signal of the conventional art.

According to the present invention, both analog and digital signals can be processed to limit their peaks without introducing intolerable levels of splatter, noise, or other characteristics which have been introduced in conventional methods.

What is claimed is:

1. An apparatus for limiting peaks of a signal, comprising:
    a signal isolation unit receiving an input signal and a reference signal, and generating an extrema signal of the input signal based on the reference signal, the extrema signal corresponding to peaks of the input signal;
    a filter receiving the extrema signal from the signal isolation unit, and filtering the extrema signal according to a predetermined filter response to generate a filter signal; and
    a combining unit combining the filter signal with the input signal delayed by a predetermined time period to generate an impulse clipped signal.

2. The invention of claim 1, further comprising:
    a clipping threshold generator providing the reference signal to the signal isolation unit.

3. The invention of claim 1, further comprising:
    a delay unit delaying the input signal by the predetermined time period, and outputting the delayed input signal to the combining unit.

4. The invention of claim 1, wherein the signal isolation unit includes:
    a peak isolation unit receiving the reference signal, and isolating the peaks of the input signal based on the reference signal to generate a peak signal.

5. The invention of claim 4, wherein the peak isolation unit includes:
    a first adder for adding the input signal and the reference signal to generate a first adder signal;
    a second adder for subtracting the reference signal from the input signal to generate a second adder signal;
    a comparator for comparing the input signal with the reference signal, and generating a selection signal based on the comparison result; and
    a multiplexer coupled to the comparator, the multiplexer outputting one of the first adder signal, the second adder signal, and a grounded signal based on the selection signal.

6. The invention of claim 4, wherein the signal isolation unit further includes:
    a local extrema isolation unit coupled to the peak isolation unit, the local extrema isolation unit receiving the peak signal from the peak isolation unit, comparing the peak signal with delayed peak signals to detect local extrema of the peak signal, and generating the extrema signal representing the detected local extrema of the peak signal.

7. The invention of claim 6, wherein the local extrema isolation unit includes a plurality of delay elements, a plurality of comparators coupled to the delay elements, a plurality of logic gates coupled to the comparators, and a multiplexer coupled to the logic gates.

8. The invention of claim 6, wherein the local extrema isolation unit includes:
    a first delay element for delaying the peak signal for a predetermined time period to generate a first delayed peak signal; and
    a second delay element for delaying the first delayed peak signal for a predetermined time period to generate a second delayed peak signal.

9. The invention of claim 8, wherein the local extrema isolation unit further includes:
    a plurality of comparators coupled to the first and second delay elements, the comparators comparing the first delayed peak signal to the peak signal output from the peak isolation unit, comparing the second delayed peak signal to the first delayed peak signal, and comparing the first delayed peak signal to a value of zero.

10. The invention of claim 9, wherein the local extrema isolation unit further includes:
    a plurality of AND-gates receiving outputs of the plurality of comparators;
    an OR-gate receiving outputs of the AND-gates and generating a selection signal based on the received outputs of the AND-gates; and
    a multiplexer for outputting one of the first delayed peak signal, the second delayed peak signal, and a grounded signal based on the selection signal of the OR-gate.

11. The invention of claim 1, further comprising:
    a hard limiting unit limiting peaks of an output signal of the combiner based on the reference signal.

12. The invention of claim 1, wherein the combining unit subtracts the filter signal from the delayed input signal.

13. A method for limiting peaks of a signal, comprising the steps of:

providing an input signal, a reference signal, and a delayed input signal;

generating an extrema signal of the input signal based on the reference signal, the extrema signal corresponding to peaks of the input signal;

filtering the extrema signal according to a predetermined filter response to generate a filter signal; and combining the filter signal and the delayed input signal to generate an impulse clipped signal.

14. The invention of claim 13, wherein said providing step includes the step of:

delaying the input signal by a predetermined time period to generate the delayed input signal.

15. The invention of claim 13, wherein said step of generating the extrema signal includes the step of:

isolating the peaks of the input signal based on the reference signal to generate a peak signal.

16. The invention of claim 15, wherein said step of isolating the peaks includes the steps of:

adding the input signal and the reference signal to generate a first adder signal;

subtracting the reference signal from the input signal to generate a second adder signal;

comparing the input signal with the reference signal and generating a selection signal based on the comparison result; and outputting one of the first adder signal, the second adder signal, and a grounded signal based on the selection signal.

17. The invention of claim 15, wherein said step of generating the extrema signal further includes the steps of:

detecting local extrema of the peak signal; and generating the extrema signal representing the detected local extrema of the peak signal.

18. The invention of claim 15, wherein said step of generating the extrema signal further includes the steps of:

first delaying the peak signal for a predetermined time period to generate a first delayed peak signal; and second delaying the first delayed peak signal for a predetermined time period to generate a second delayed peak signal.

19. The invention of claim 18, wherein said step of generating the extrema signal further includes the step of:

comparing the first delayed peak signal to the peak signal, the second delayed peak signal to the first delayed peak signal, and the first delayed peak signal to a value of zero.

20. The invention of claim 19, wherein said step of generating the extrema signal further includes the steps of:

ANDing outputs resulting from said comparing step;

ORing outputs resulting from said ANDing step; and generating one of the first delayed peak signal, the second delayed peak signal, and a grounded signal based on an output resulting from said ORing step.

21. The invention of claim 13, further comprising:

hard-limiting peaks of an output signal resulting from said combining step based on the reference signal.

22. The invention of claim 13, wherein in said combining step, the filter signal is subtracted from the delayed input signal.

* * * * *